US012642099B2

(12) United States Patent
Yen et al.

(10) Patent No.:  US 12,642,099 B2
(45) Date of Patent:       May 26, 2026

(54) CHIP PACKAGE STRUCTURE AND METHOD FOR PREVENTING WARPAGE OF CHIP PACKAGE STRUCTURE

(71) Applicant: Taiwan Semiconductor Manufacturing Company, Ltd., Hsinchu (TW)

(72) Inventors: Chen-Hsuan Yen, Hsinchu (TW); Jen-Yuan Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 358 days.

(21) Appl. No.: 18/202,057

(22) Filed: May 25, 2023

(65) Prior Publication Data

US 2024/0395729 A1      Nov. 28, 2024

(51) Int. Cl.
*H01L 25/065*      (2023.01)
*H01L 23/00*      (2006.01)
*H01L 23/538*      (2006.01)
*H01L 25/00*      (2006.01)

(52) U.S. Cl.
CPC ........ *H01L 23/562* (2013.01); *H01L 23/5381* (2013.01); *H01L 24/08* (2013.01); *H01L 25/0655* (2013.01); *H01L 25/50* (2013.01); *H01L 2224/08225* (2013.01)

(58) Field of Classification Search
CPC ... H01L 23/562; H01L 23/5381; H01L 24/08; H01L 25/0655; H01L 25/50; H01L 2224/08225; H01L 2225/1035; H01L 21/6835; H01L 2225/06541; H01L 2225/06517; H01L 23/5383; H01L 23/5384; H01L 23/5385

See application file for complete search history.

(56) References Cited

U.S. PATENT DOCUMENTS

2023/0067714 A1*   3/2023   Chang ................. H01L 25/0657

FOREIGN PATENT DOCUMENTS

| | | |
|---|---|---|
| TW | 583728 B | 4/2004 |
| TW | I243428 B | 11/2005 |

OTHER PUBLICATIONS

Taiwanese Notice of Allowance and Search Report for Taiwanese Application No. 112142319, dated Jun. 4, 2024.

* cited by examiner

*Primary Examiner* — Thanh Y. Tran
(74) *Attorney, Agent, or Firm* — Birch, Stewart, Kolasch & Birch, LLP

(57)              ABSTRACT

A chip package structure includes a first semiconductor device, a second semiconductor device, a die bonding structure, a package carrier and a stress balance structure. The first semiconductor device has a first redistribution structure, the second semiconductor has a second redistribution structure, and the die bonding structure is electrically connected between the first redistribution structure and the second redistribution structure. The package carrier covers the first semiconductor device and the second semiconductor device, and the stress balance structure is disposed in the package carrier.

20 Claims, 10 Drawing Sheets

X←——→X

160

110

Y←——→Y

160

110

CHIP PACKAGE STRUCTURE AND METHOD FOR PREVENTING WARPAGE OF CHIP PACKAGE STRUCTURE

BACKGROUND

As the semiconductor industry introduces new generations of integrated circuits (IC) having higher performance and more functionality, the density of the elements forming the ICs increases, while the dimensions, sizes and spacing between components or elements are reduced. The semiconductor industry continues to improve the integration density of various electronic components (e.g., transistors, diodes, resistors, capacitors, etc.) by continual reductions in minimum feature size, which allow more components to be integrated into a given area.

SoIC chip package structure is usually composed of more than three dies. Since the cross-sections of chip package structure (e.g., chip size, die type, gap fill volume) in X and Y directions are different, it will result in different warpages in the X and Y directions, and the thermal stress and the stress accumulation will produce irregular shapes and crack risk on the chip package structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
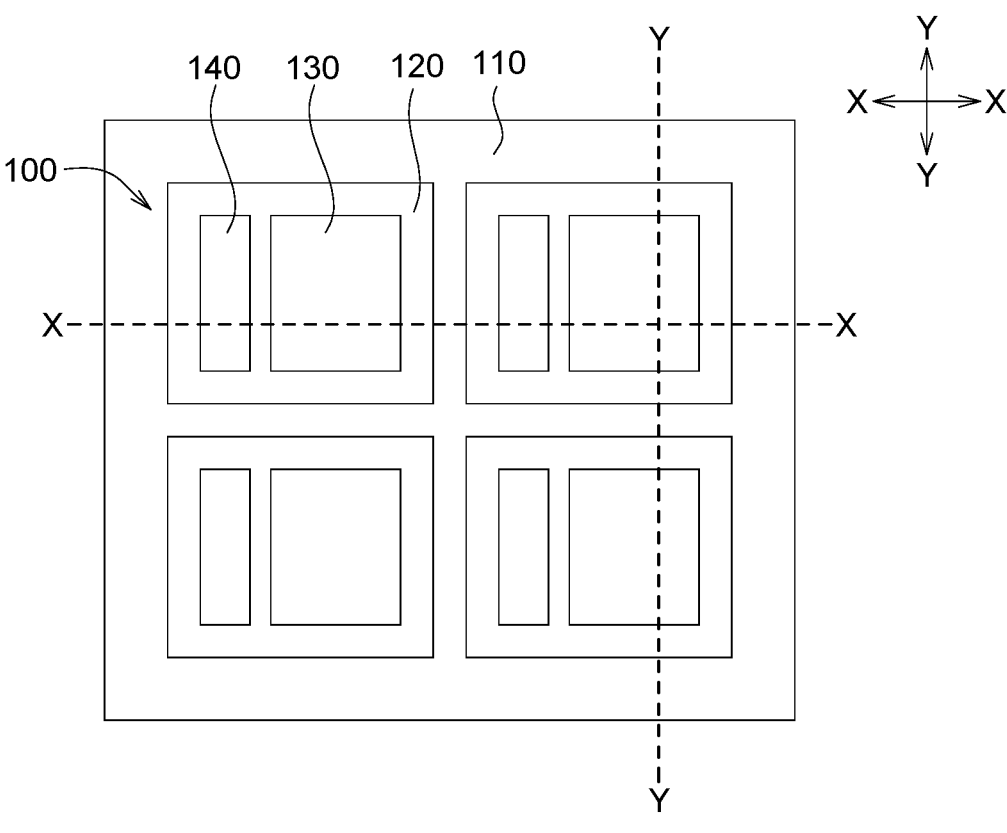
FIGS. 1A to 1C are respectively a top view of a wafer-level chip package structure, a schematic cross-sectional view of a chip package structure along the X-X axis, and a schematic cross-sectional view of a chip package structure along the Y-Y axis.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
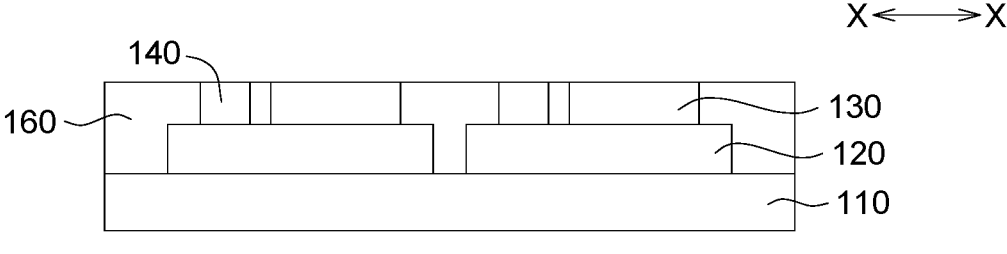
Figure 1C:
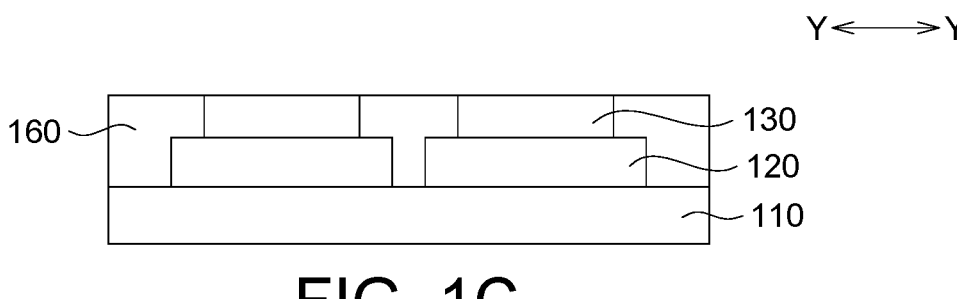

FIGS. 1A to 1C are a top view of a wafer-level chip package structure, a schematic cross-sectional view along the X-X axis thereof, and a schematic cross-sectional view along the Y-Y axis thereof, respectively. The chip package structure 100 in the present embodiment includes a carrier substrate 110, a first semiconductor device 120 and a second semiconductor device 130 stacked to each other on the carrier substrate 110. The chip package structure 100 can be completed by fan-out wafer-level packaging (FOWLP) technology, and FOWLP is improvements to wafer-level packaging (WLP) for providing more external connections to semiconductor devices. The first and second semiconductor devices 120, 130 are sequentially disposed on the carrier substrate 110, and the first and second semiconductor devices 120, 130 are encapsulated by an epoxy molding material (EMC) 160, and then the first and second The semiconductor devices 120 and 130 are bonded through hybrid bonding or fusion bonding and copper bumps are used as the die bonding structure to form a system-on-integrated chip (SoIC) package structure 100.

Figure 2A:
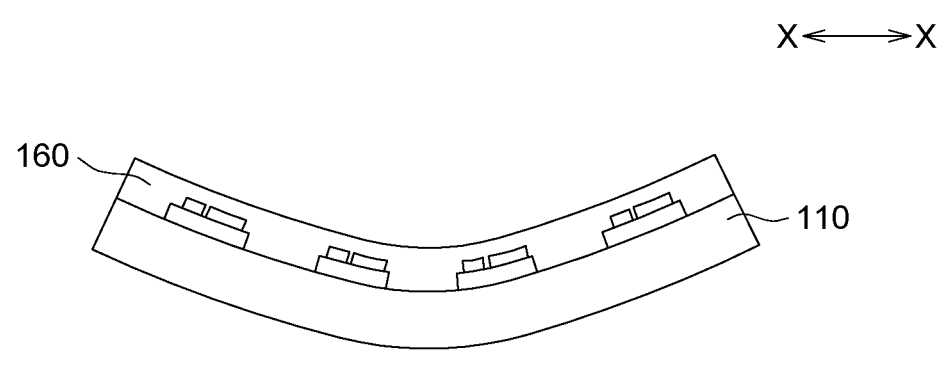
FIGS. 2A to 2B are respectively schematic diagrams of the stress distribution of the chip package structure in different warping directions.
Figure 2B:
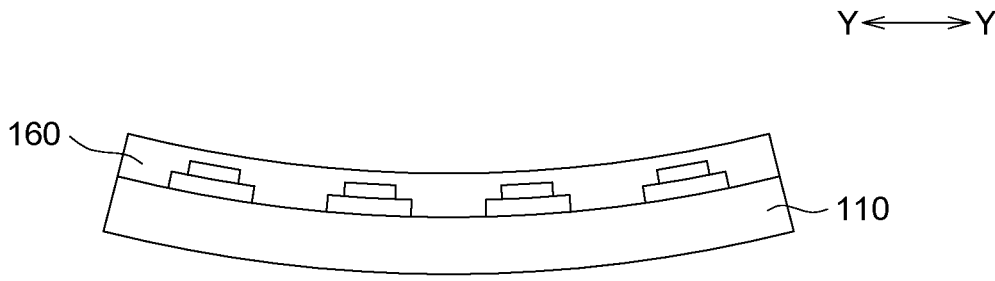

In the system-on-integrated chip package structure 100, the first and second semiconductor devices 120, 130 and the epoxy resin molding material (EMC) 160 are made of different materials and in close contact, and the mismatch of thermal expansion coefficients will cause adjacent materials generate thermal stress. For example, during the thermal treatment process, undesired bending may occur due to the different component configurations in the respective axial directions of the chip package structure 100. As shown in FIG. 1B and FIG. 1C, the component configuration along the X-X axis and the component configuration along the Y-Y axis have different structures, resulting in warpage along the X-X axis and warpage along the Y-Y axis different as shown in FIGS. 2A and 2B, respectively. Furthermore, the thermal stress and the stress accumulation will produce irregular shapes and crack risk on the X-X axis and Y-Y axis of the chip package structure. In order to solve this problem, the present embodiment provides a technique of depositing a stress balance material 153 in the package carrier 150. The stress balance material 153 is used to balance the warpage of the chip package structure 100 in different axes and reduce the degree of warping.

Referring to FIGS. 3A to 3D, FIGS. 3A to 3D are respectively schematic diagrams of the stress balance structure 151 of the chip package structure 101 according to an embodiment of the present disclosure. The stress balance structure 151 is embedded in the package carrier 150, and the stress balance structure 151 includes a plurality of trenches 152 and filling materials (i.e., stress balance materials 153, such as conductive materials, insulating materials or semiconductor materials) filled in the trenches 152. The stress balance material 153 may include aluminum, copper, tungsten, titanium, TaN, TiN, silicon dioxide, silicon carbide, silicon nitride, combinations of the above materials, or other suitable materials. The size and position of the stress balance structure 151 depends on the warpage characteristics of the chip package structure 101. In various embodiments, the package carrier 150 can be made of fiber material, polymer material, semiconductor material, glass material or any other suitable material. In some embodiments, the package carrier 150 is made of semiconductor material, such as silicon or germanium. To form the trench 152, a patterned mask (not shown) is formed on the package carrier 150 using a patterning and etching process. The mask can be a photoresist mask or a hard mask. In some examples, the hard mask is made of silicon oxide ($SiO_2$), silicon carbonitride (SiCN), silicon oxycarbide (SiOC), silicon oxycarbonitride (SiOCN), or silicon nitride (SiN or $Si_3N_4$) or other suitable material. Using a patterned mask, trenches 152 may be etched in package carrier 150. The etching process may include reactive ion etching (RIE), neutral beam etching (NBE), inductively coupled plasma (ICP) etching, or other suitable processes or combinations thereof.

In FIGS. 3A to 3D, stress balance structures 151 are selectively formed in the trenches 152 to counteract or reduce warpage caused by thermal stress. For example, metals tend to have higher coefficients of thermal expansion than semiconductors such as silicon, germanium, etc., depending on processing conditions. Dielectrics, such as silicon oxide, silicon nitride, etc., tend to have a lower coefficient of thermal expansion than semiconductors. Therefore, at room temperature, dielectric films tend to be under compressive stress or have compressive strain. In contrast, thin metal films tend to be under tensile stress or have tensile strain. These properties can be used to deposit different materials in the trenches 152 to affect the warpage of the chip package structure 100. For example, if the chip package structure 101 warps upward due to thermal stress, a stress balance material 153 (such as metals) that causes the chip package structure 101 to bend downward may be selected to resist the warpage. Similarly, if the chip package structure 101 warps downward due to thermal stress, a stress balance material 153 (such as dielectrics) that causes the chip package structure 101 to bend upward may be selected to resist the warpage.

Figure 3A:
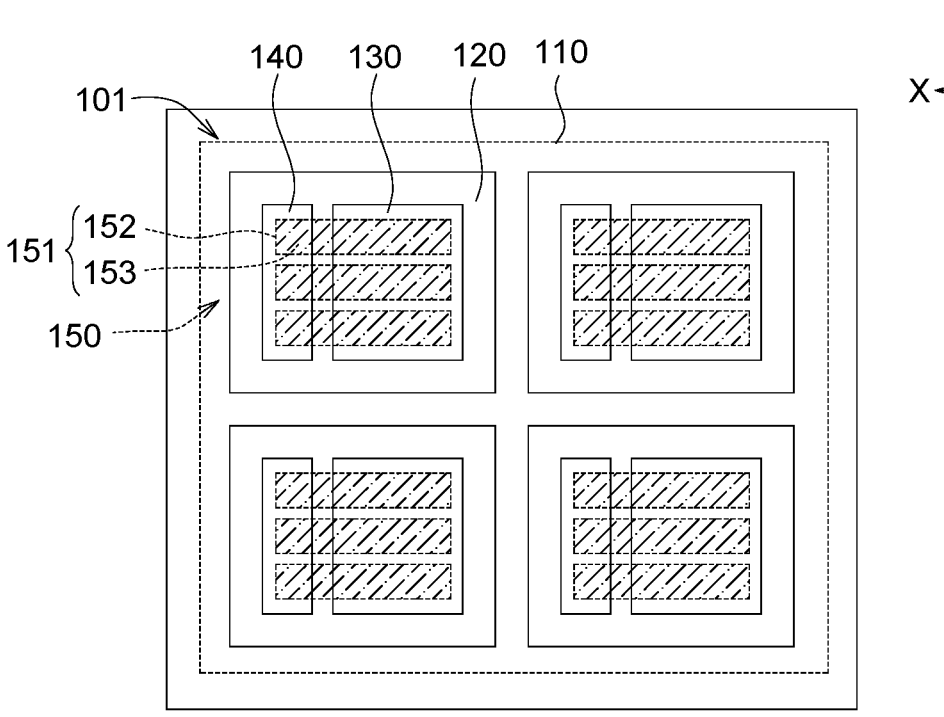
FIGS. 3A to 3D are respectively schematic diagrams of a stress balance structure of a chip package structure according to an embodiment of the present disclosure.
Figure 3B:
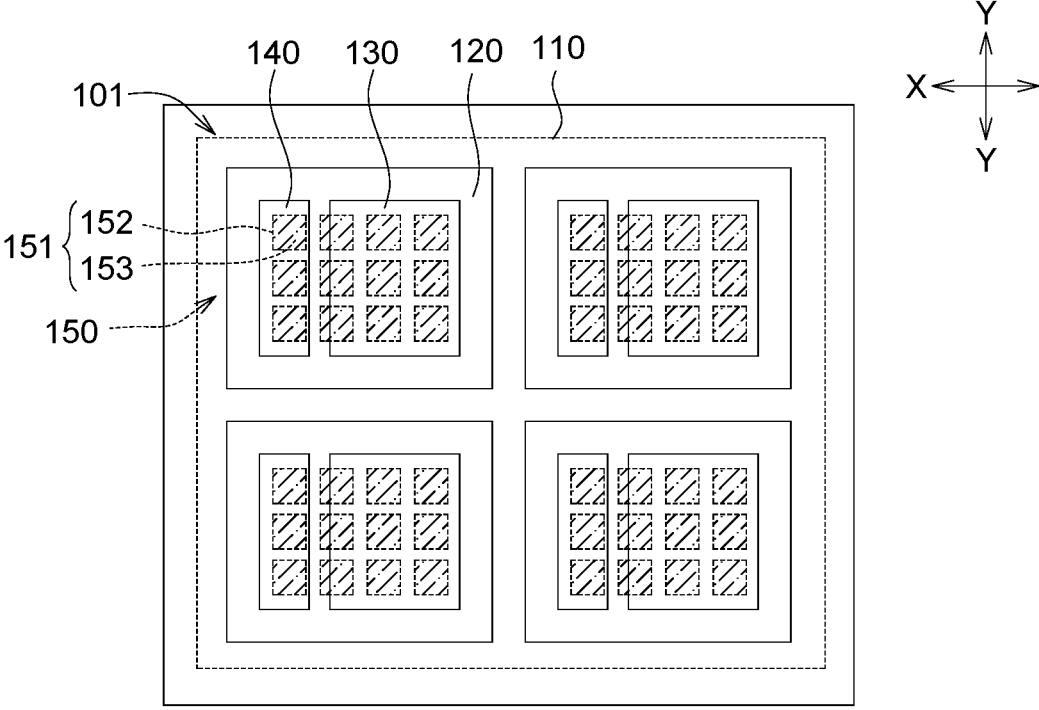
Figure 3C:
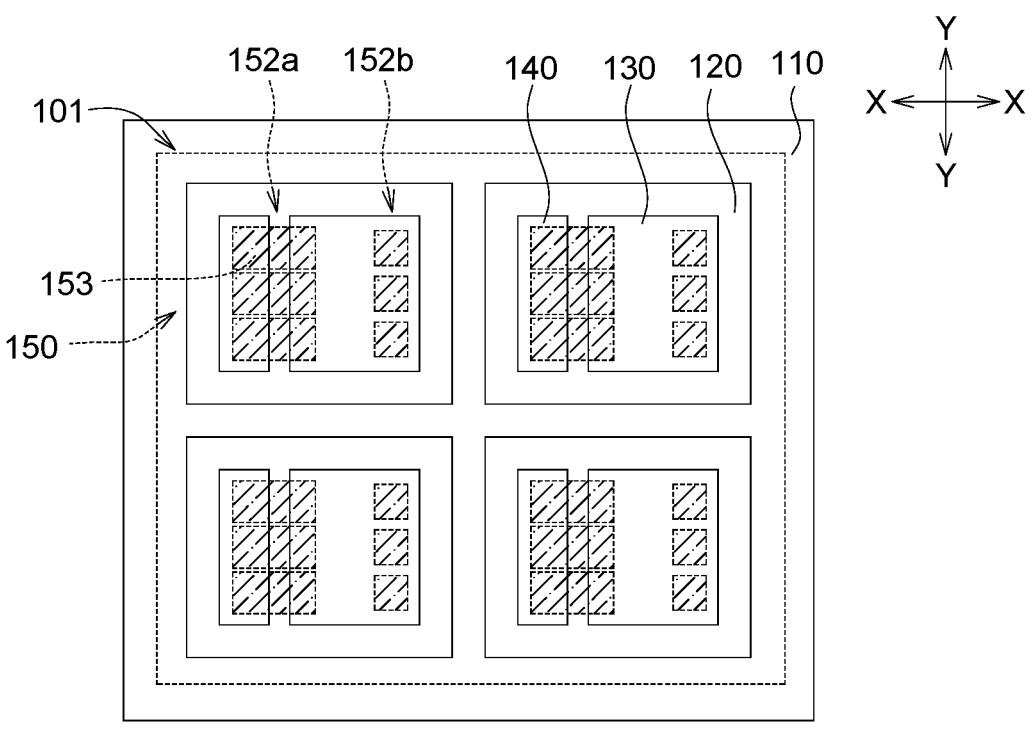

In some embodiments, the amount of warpage can be adjusted by the trench density and the stress balance material 153 formed within the trenches 152. In FIG. 3A, the trench 152 in the package carrier 150 may be an elongated structure with a long side perpendicular to the warping direction (i.e., the X-axis or Y-axis direction) or parallel to the warping direction (i.e., the X-axis or Y-axis direction). In FIG. 3B, the trenches 152 in the package carrier 150 can be arranged in a matrix in a square pattern, a circular pattern or a triangular pattern, etc., wherein the density distribution of the trenches 152 on the X-axis direction can be different from that of the trenches 152 on the Y-axis. In FIG. 3C, the trenches 152 in the package carrier 150 can be in a square pattern, a circular pattern, or a triangular pattern with different density distributions. For example, in FIG. 3C, the stress balance structure 151 includes at least one first trench 152a and at least one second trench 152b (such as a square pattern or a circular pattern), and the size and area density of the first trenches 152a are greater than that of the second trenches 152b, so that the stress balance characteristic at the area of the first trenches 152a greater than the stress balance characteristic at the area of the second trenches 152b.

Figure 3D:
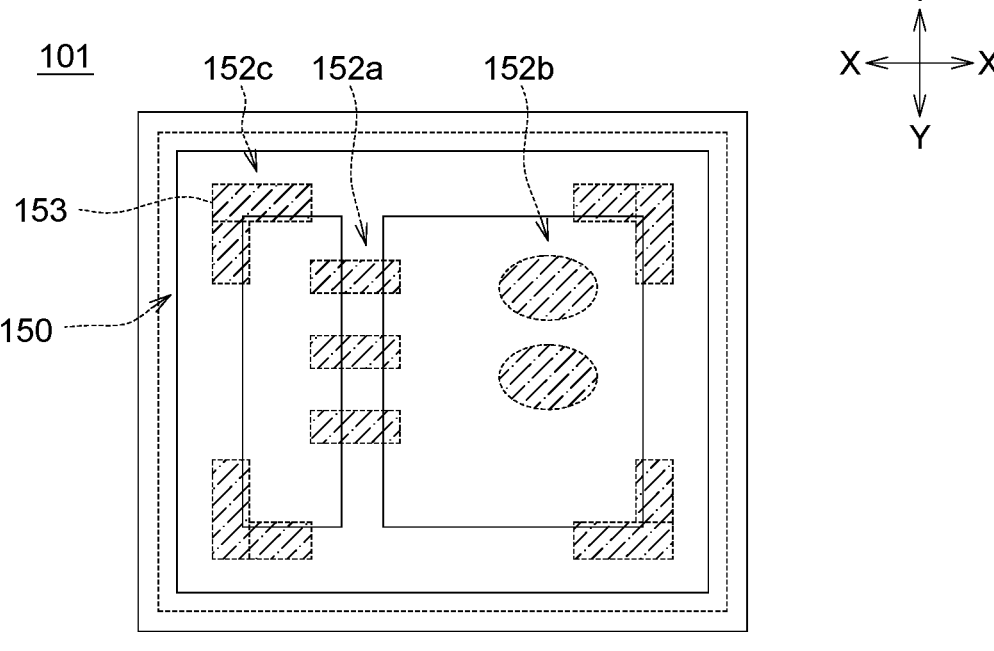

In FIG. 3D, the stress balance structure 151 includes at least one third trench 152c disposed at a corner of the package carrier 150. In this example, a plurality of third trenches 152c is formed at the corners of the package carrier 150 to resist the stress at the corner of the chip package structure 101. For example, the two sides of the third trenches 152c vertically intersect at 90 degrees and are parallel to or arranged at a certain angle (for example, 45 degrees) with the two sides adjacent to the corners of the package carrier 150.

In some embodiments, since the stress balance characteristics of the trenches 152 include trench width, trench pitch, trench length and trench depth, we can select an appropriate trench width, trench pitch, trench length, trench depth, and trench density according to the warpage characteristic of the chip package structure 101. For example, the width of the trenches 152 is in the range between 1 μm and 20 μm, e.g., 12 μm. The pitch of the trenches 152 is in the range between 1 μm and 120 μm, e.g., 80 μm. The length of the trench 152 is in the range between 1 μm and 2000 μm, e.g., 400 μm. Furthermore, according to some embodiments, the depth of the trench 152 is in the range between 1 μm and 250 μm, e.g., 70 μm. Additionally, the overall density of trenches 152 can be increased to increase warpage resistance effect.

Figure 4A:
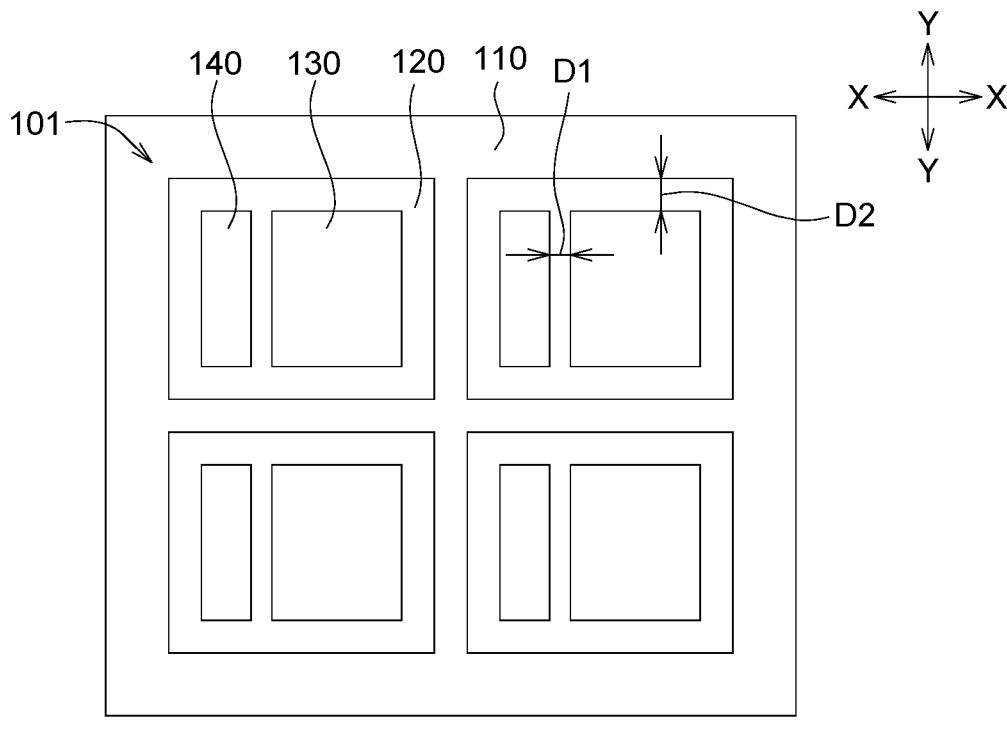
FIGS. 4A to 4C are respectively top views and a schematic cross-sectional view of a chip package structure and a stress balance structure thereof according to an embodiment of the present disclosure.
Figure 4B:
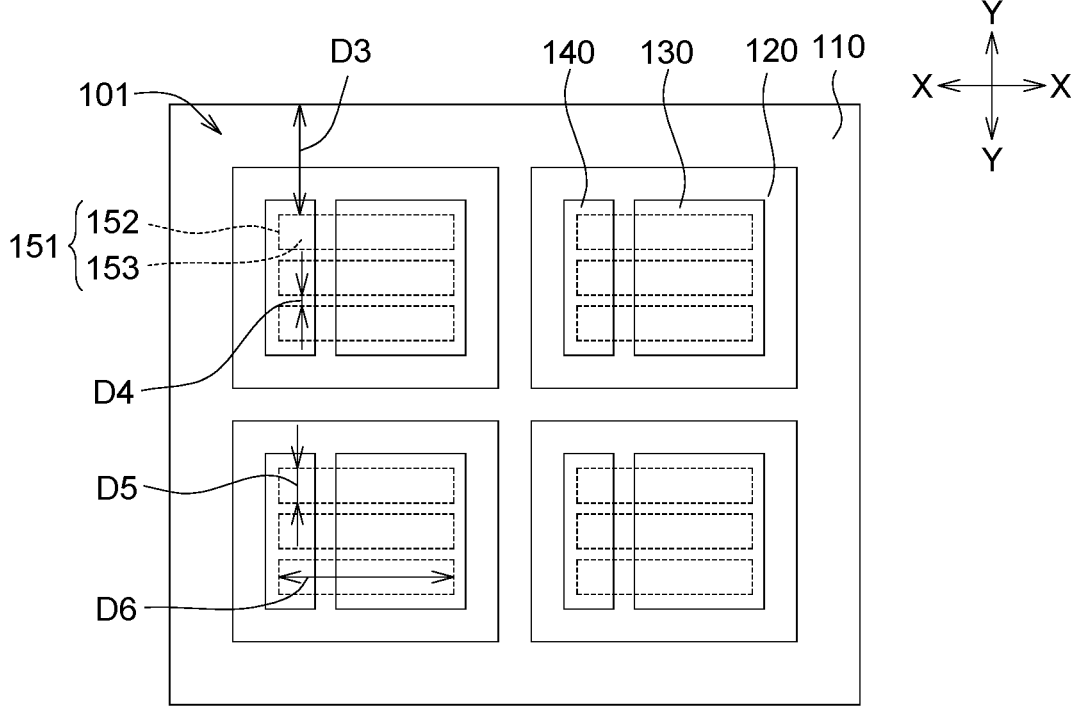
Figure 4C:
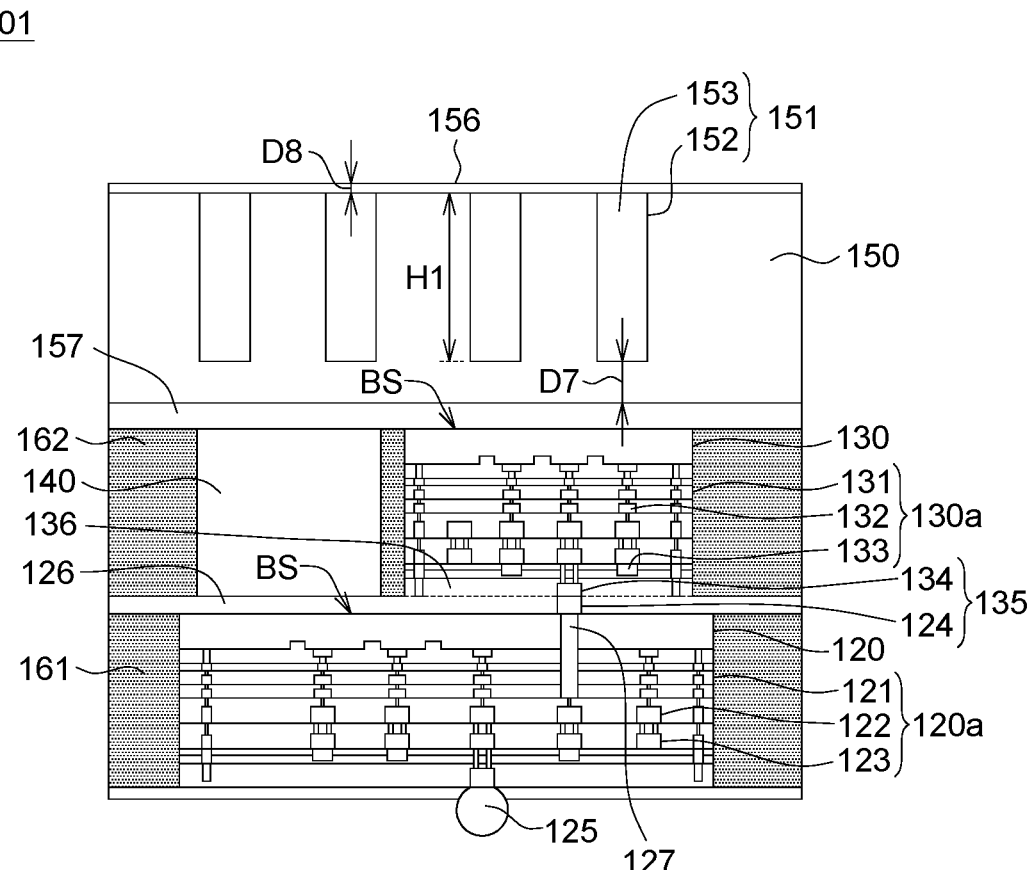

Referring to FIGS. 4A to 4C, FIGS. 4A to 4C are respectively top views and a schematic cross-sectional view of a chip package structure 101 and a stress balance structure 151 thereof according to an embodiment of the present disclosure. In some embodiments, the distance D1 between two adjacent semiconductor devices is, for example, greater than 1 μm, the edge-to-edge distance D2 of the two stacked semiconductor devices is, for example, greater than 0 μm, the distance D3 between the outermost edge of the first semiconductor device 120 and the edge of the stress balance structure 151 is, for example, greater than 1 μm, the distance D4 between two adjacent stress balance structures 151 is, for example, greater than 0.1 μm, the width D5 of the stress balance structure 151 is, for example, greater than 1 μm, and the length D6 of the stress balance structure 151 is, for example, greater than 1 μm. The length direction of the stress balance structure 151 is, for example, perpendicular to the length direction of the second semiconductor device 130. In addition, in FIG. 4C, the distance D7 between the bottom of the stress balance structure 151 and the top surface of the second semiconductor device 130 is greater than 1 μm, for example. In some embodiments, the length D6 of the trench 152 is smaller than the edge length of the first semiconductor device 120, such as from 10% to 70%. In some examples, the length D6 of the trench 152 is 25% to 50% of the edge length of the chip packaging area, and it is advisable not to exceed the boundary of the chip packaging area, so as to avoid the wafer cutting tool from cutting the stress balance structure 151.

Referring to FIG. 4C, the chip package structure 100 includes first and second semiconductor devices 120 and 130, a dummy device 140 and a package carrier 150 stacked on each other. The first semiconductor device 120 has a first redistribution structure 120a, the second semiconductor device 130 has a second redistribution structure 130a, and the die bonding structure 135 is electrically connected between the first redistribution structure 120a and the second redistribution structure 130a. The package carrier 150 covers the first semiconductor device 120 and the second semiconductor device 130, and the stress balance structure 151 is disposed in the package carrier 150. In addition, the first dielectric layer 161 encapsulates the first semiconductor device 120, and the second dielectric layer 162 encapsulates the second semiconductor device 130 and the dummy device 140. The first dielectric layer 161 and the second dielectric layer 162 can be formed by chemical vapor deposition (CVD), atomic layer deposition (ALD), spin coating or other suitable processes. The first dielectric layer 161 and the second dielectric layer 162 can be made of amorphous SiOx, SiOxCyHz, SiOxCy, SiCx or related low-k value materials, and the range of k value can be between 2.0 to 3.0 or 2.5 to 3.5.

In this embodiment, a first/second redistribution structure 120a/130a of the first/second semiconductor device 120/130 can be used to provide high interconnect density and flexible routing for a wafer-level multi-chip package structure. To achieve these advantages, a silicon-free interposer can be used in addition to the redistribution layer (RDL, e.g., 120a and 130a) used in a fan-out package structure. Multiple semiconductor devices can form large computing systems on a wafer, rather than on a traditional printed circuit board (PCB). A plurality of semiconductor devices is disposed on a wafer-level interposer (e.g., a back end of line (BEOL) layer). In FIGS. 4C to 6B of the disclosure, the wafer-level back-end process layer supports electrical interconnection between two adjacent semiconductor devices (e.g., 120 and 130). Semiconductor devices can be bonded on one or both sides of the wafer-level interposer (WLI, the figure is not shown) to improve yield and allow high density integration. This single or double sided assembly provides system application flexibility. A known good die (KGD) may be used to provide good system yield. Metal-to-metal bonding (e.g., Cu—Cu bonding e.g., 124 and 134) can be used between semiconductor devices (e.g., 120 and 130) and the wafer-level interposer to form multiple fine pitch contact pads for high-density signals and to form larger contact pads for low resistance to enable lower power and result in better yield for high-speed signals. Multiple system modules can be aggregated into one wafer-level system to reduce cost by simplifying system architecture. It can have different functions such as logic, memory, input/output (I/O), power management integrated circuit (PMIC) or integrated passive device (IPD) for multiple semiconductor devices (e.g., 120 and 130) integrated on a wafer-level system to provide design flexibility for different applications.

The first semiconductor device 120 and the second semiconductor device 130 can be logic chips (for example, a central processing unit (CPU), a graphics processing unit (GPU), a system chip (system-on-a-chip, SoC), application processor (AP), microcontroller, memory die (for example, dynamic random access memory (DRAM), static random access memory (SRAM), etc.), power management die (for example, power management integrated circuit (PMIC)), radio frequency (RF) die, sensor die, micro-electro-mechanical-system (MEMS) die, signal processing die (for example, digital signal processor (DSP)), front-end die (for example, analog front-end (AFE) die), application-specific die (for example, application-specific integrated circuit (ASIC), field-programmable gate array (FPGA), etc.), Input/Output (I/O) die, integrated passive device (IPD) die, similar die, or combinations thereof.

In some embodiments, the die bonding structure 135 between the first semiconductor device 120 and the second semiconductor device 130 can use a suitable bonding method (for example, a metal-metal bonding) to connect with the first redistribution structure 120a and the second redistribution structure 130a. The die bonding structure 135 includes a first conductive bump 124 and a second conductive bump 134. The first conductive bump 124 and the second conductive bump 134 are, for example, copper bumps. The first conductive bump 124 is disposed on the backside of the first semiconductor device 120, the first conductive bump 124 can be electrically connected to the redistribution wiring interconnect 122 of the first redistribution structure 120a through the TSV structure 127. The second conductive bump 134 is disposed on the active side of the second semiconductor device 130, and the second conductive bump 134 is electrically connected to the redistribution wiring interconnect 132 of the second redistribution structure 130a.

In some embodiments, the first redistribution structure 120a may include a first redistribution dielectric layer 121, a first redistribution wiring interconnect 122 and a first bonding pad 123. The first redistribution dielectric layer 121 includes a dielectric polymer material, such as polyimide (PI), benzocyclobutene (BCB) or polybenzobisoxazole (PBO). Each of the first redistribution dielectric layers 121 may be formed by spin coating and drying the dielectric polymer material. The thickness of each first redistribution dielectric layer 121 may be in the range of 2 microns to 40 microns (e.g., 4 microns to 20 microns). The photoresist layer can be applied over each first redistribution dielectric layer 121 and patterned using an etching process (e.g., anisotropic etching process) to transfer the pattern in the photoresist layer into the first redistribution dielectric layer 121. Subsequently, the photoresist layer can be removed by ashing, for example. Additionally, the metal fill material for the first redistribution wiring interconnects 122 may include copper, nickel, or a combination thereof. The thickness of the metal fill material deposited to form each of first redistribution wiring interconnects 122 may be in the range of 2 microns to 40 microns (e.g., 4 microns to 10 microns), but smaller or greater thicknesses may also be used. The total number of wiring levels in the first redistribution structure 120a may range from 1 to 10. Additionally, the first bonding pad 123 may be configured for soldering ball bonding, and the soldering balls 125 may have a thickness in the range of 25 microns to 50 microns.

The structure and manufacturing method of the second redistribution structure 130a are similar to that of the first redistribution structure 120a, which has been illustrated in the above disclosure. The second redistribution structure 130a may include a second redistribution dielectric layer 131, a second redistribution wiring interconnect 132 and a second bonding pad 133. The second redistribution dielectric layer 131 includes a dielectric polymer material, such as polyimide (PI), benzocyclobutene (BCB), or polybenzobisoxazole (PBO). The metal fill material for the second redistribution wiring interconnects 132 may include copper, nickel, or both copper and nickel. The metal fill material for the second bond pads 133 may include copper. Additionally, the second bond pads 133 may be configured for micro-bump (e.g., copper pillar) bonding, and the micro-bump (i.e., the second conductive bump 134) may have a thickness in the range of 25 microns to 50 microns.

In addition, the soldering materials (e.g., solder balls 125) can be formed on the first bonding pads 123, and the chip package structure 101 and a carrier (e.g., a silicon substrate or a glass epoxy-based circuit board, etc.) are electrically connected to each other through the soldering balls 125. In addition, soldering balls 125 may be ball grid array (BGA) connectors, solder balls, metal pillars, controlled collapse chip connections by (C4) bumps, bumps formed electroless nickel-electroless palladium-immersion gold (ENEPIG) technology, or the like.

In some embodiments, the first semiconductor device 120 includes a first bonding film 126, and the second semiconductor device 130 includes a second bonding film 136. The first bonding film 126 is disposed on the backside BS of the first semiconductor device 120, and the second bonding film 136 is disposed on the active side of the second semiconductor device 130. The active side of the second semiconductor device 130 is arranged on the first bonding film 126 on the backside of the first semiconductor device 120 with the second bonding film 136. In some embodiments, hybrid bonding or fusion bonding is used to bond the first semiconductor device 120 and the second semiconductor device 130 to each other. The bonding includes pre-bonding and annealing. During the pre-bonding, a small pressure is applied to bond the first semiconductor device 120 and the second semiconductor device 130 to each other by van der Waals force. Pre-bonding may be performed at room temperature (e.g., between about 21° C. and about 25° C.), although higher temperatures may also be used.

In some embodiments, the first conductive bump 124 passes through the first bonding film 126, the second conductive bump 134 passes through the second bonding film 136, and the first conductive bump 124 and the second conductive bump 134 connect to each other using hybrid bonding or fusion bonding. The second semiconductor device 130 can be electrically connected to the first redistribution structure 120a of the first semiconductor device 120 through the die bonding structure 135 and the TSV structure 127 to reduce signal transmission paths.

In some embodiments, the orthographic projection of the stress balance structure 151 overlaps with the location of the first semiconductor device 120, and it is advisable not to exceed the boundary of the chip package area, so as to avoid the wafer dicing tool from cutting the stress balance structure 151. In addition, the top of the stress balance structure 151 is covered by a capping layer 156, such as a dielectric including silicon oxide, silicon nitride, etc., and the capping layer 156 has a lower thermal expansion coefficient than semiconductors and has a thickness D8, for example, greater than 0.1 μm.

In some embodiments, the package carrier 150 can be a heat dissipation substrate, such as a heat dissipation substrate with a high thermal conductivity (140-200 W/mk) and a low thermal expansion coefficient ($6.5\text{-}9.5\times10^{-6}$/K). A silicon substrate or other suitable materials can be applied on the chip package structure 101 with multiple semiconductor devices to improve heat dissipation performance and match the thermal expansion coefficients of the second semiconductor device 130 and the dummy device 140. The heat dissipation substrate (i.e., package carrier 150) is mounted on top of the chip package structure 101 by, for example, a high dielectric constant adhesive 157. The adhesive 157 is, for example, epoxy resin, and silicon dioxide can be added into the adhesive 157 to reduce the coefficient of thermal expansion. The chip package structure 101 with a heat dissipation substrate can be applied in fields with high heat dissipation requirements such as mobile communications, satellite communications, high-speed computing, and automobiles, and can also be applied in general consumer electronics products.

In some embodiments, the package carrier 150 can be a second carrier substrate (such as a silicon substrate), and the package carrier 150 is bonded to the first semiconductor device 120 and the second semiconductor device 130 on the first carrier substrate 110 (see FIGS. 1A to 1C) with the adhesive 157. Next, a patterning process is performed on the backside of the package carrier 150, and the trench 152 can be etched in the package carrier 150 by using the patterned mask. Next, a stress balance material 153 is deposited in the trench 152 with a metal material or an insulating material by chemical vapor deposition, physical vapor deposition, spin coating or other suitable processes. A planarization process, such as chemical mechanical polishing (CMP), grinding, etching, combinations thereof, etc., may be performed after the deposition process is completed. The planarization process may remove a portion of the package carrier 150 to make the package carrier 150 thinner. After the planarization process is completed, the first carrier substrate 110 (see FIGS. 1A to 1C) is removed, and the package carrier 150 is singulated to complete the chip package structure 101 (see FIG. 4C).

In some embodiments, the trench position, trench density, trench width, length and depth of the stress balance structure 151 can be determined according to the warpage characteristics (warpage amount) of the chip package structure 101, and the trenches 152 of the stress balance structure 151 may have different depths, have different lengths or widths, or have different densities. Warpage characteristics can be measured, for example, using shadow ripple or other measurement methods, or, using theoretical analysis or computer simulation methods to determine warpage characteristics, or, using machine learning of artificial intelligence algorithms, such as neural networks, linear regression, etc., can also determine the warpage characteristics.

Figure 5A:
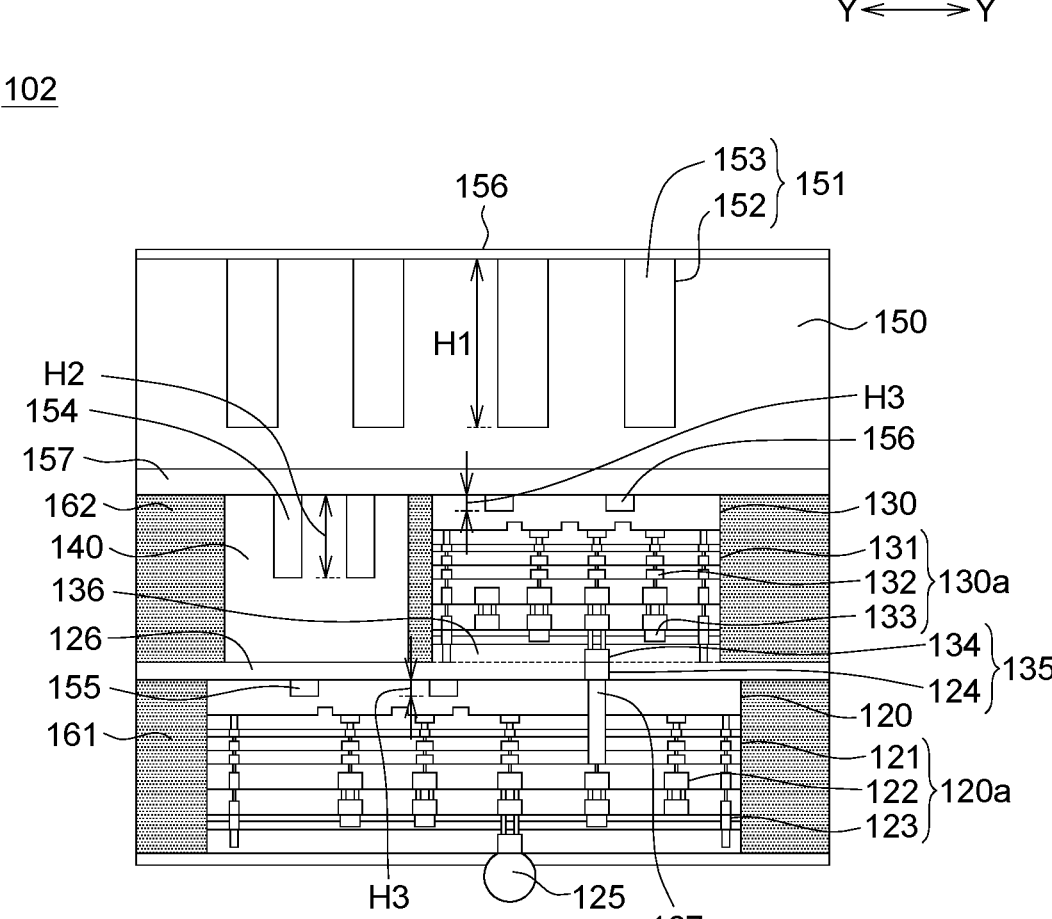
FIGS. 5A to 5B are respectively schematic cross-sectional views of a chip package structure and a stress balance structure thereof according to two embodiments of the present disclosure.
Figure 5B:
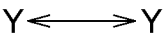
Figure 5B:
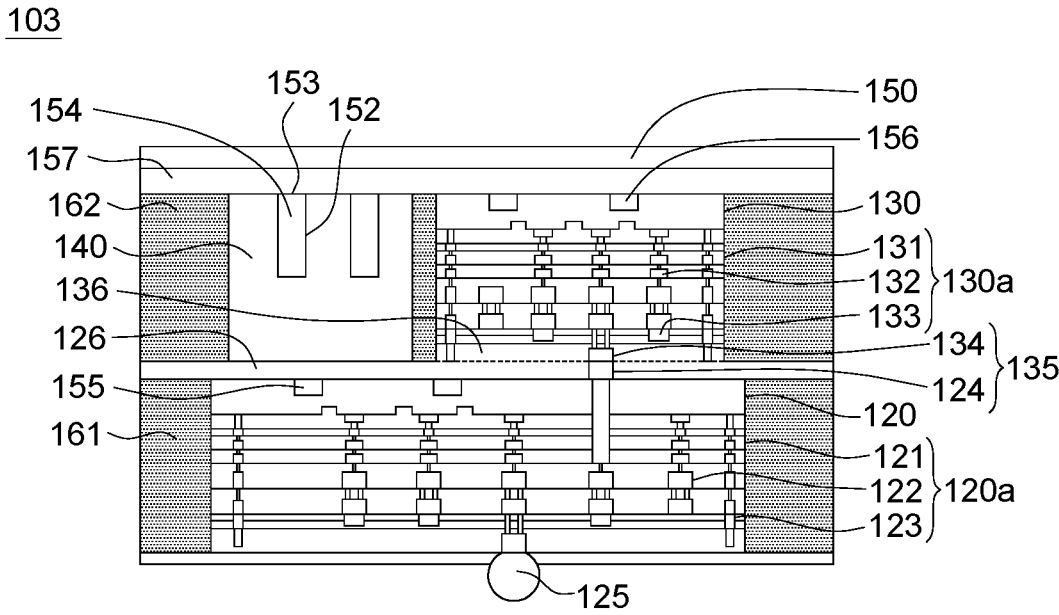

Referring to FIGS. 5A and 5B, FIGS. 5A and 5B are schematic cross-sectional views of chip package structures 102 and 103 along the Y-Y axis and stress balance structures thereof according to two embodiments of the present disclosure, respectively. In FIG. 5A, in addition to forming a stress balance structure 151 on the back side of the package carrier 150, the chip package structure 102 can also form at least one stress balance structure 154-156 in the first semiconductor device 120, the second semiconductor device 130 and/or the dummy device 140. As shown in FIG. 5A, the second stress balance structure 155 is formed on the backside of the first semiconductor device 120, the third stress balance structure 156 is formed on the backside BS of the second semiconductor device 130, and the fourth stress balance structure 154 is formed on the backside BS of the dummy device 140. The positions, numbers and densities of these stress balance structures 154-156 can be determined according to the warpage characteristics (warping amount) of the chip package structure 101.

That is to say, the stress balance structure can be selectively formed in at least one of the package carrier 150, the first semiconductor device 120, the second semiconductor device 130 and the dummy device 140, and the stress balance structure includes a plurality of trenches 152 and a stress balance material 153 (such as conductive material, insulating material or semiconductor material) filled in the trenches 152. The stress balance material 153 may include aluminum, copper, tungsten, titanium, TaN, TiN, silicon dioxide, silicon carbide, silicon nitride or other suitable materials.

In some embodiments, the trench depth H1 in the package carrier 150 may be greater than the trench depth H2 in the dummy device 140, and the trench depth H2 in the dummy device 140 may be greater than the trench depths H3 of the first semiconductor device 120 and the second semiconductor device 130. In other embodiments, the trench depth H1 in the package carrier 150 may be less than or equal to the trench depth H2 in the dummy device 140, and the trench depth H2 in the dummy device 140 may be less than or equal to the trench depths H3 of the first semiconductor device 120 and the second semiconductor device 130.

In FIG. 5B, the stress balance structure is not limited to be formed on the backside of the package carrier 150, but is formed in at least one of the first semiconductor device 120, the second semiconductor device 130, and the dummy device 140. Since the stress balance structure 151 is not formed on the backside of the package carrier 150, the thickness of the package carrier 150 can be further reduced. In addition, in FIG. 5B, since no integrated circuits or electronic components (e.g., transistors, diodes, resistors, capacitors, etc.) are provided in the dummy device 140, trenches 152 with a high aspect ratio can be formed on the backside of the dummy device 140 and filled with stress balance material 153 (that is, the stress balance structure 154). The carrier substrate of the first semiconductor device 120 and the second semiconductor device 130 is provided with integrated circuits and electronic elements inside. Compared with the trench of the dummy device 140, the aspect ratio of the trench 152 is smaller than that of the trench 152 of the dummy device 140.

Figure 6A:
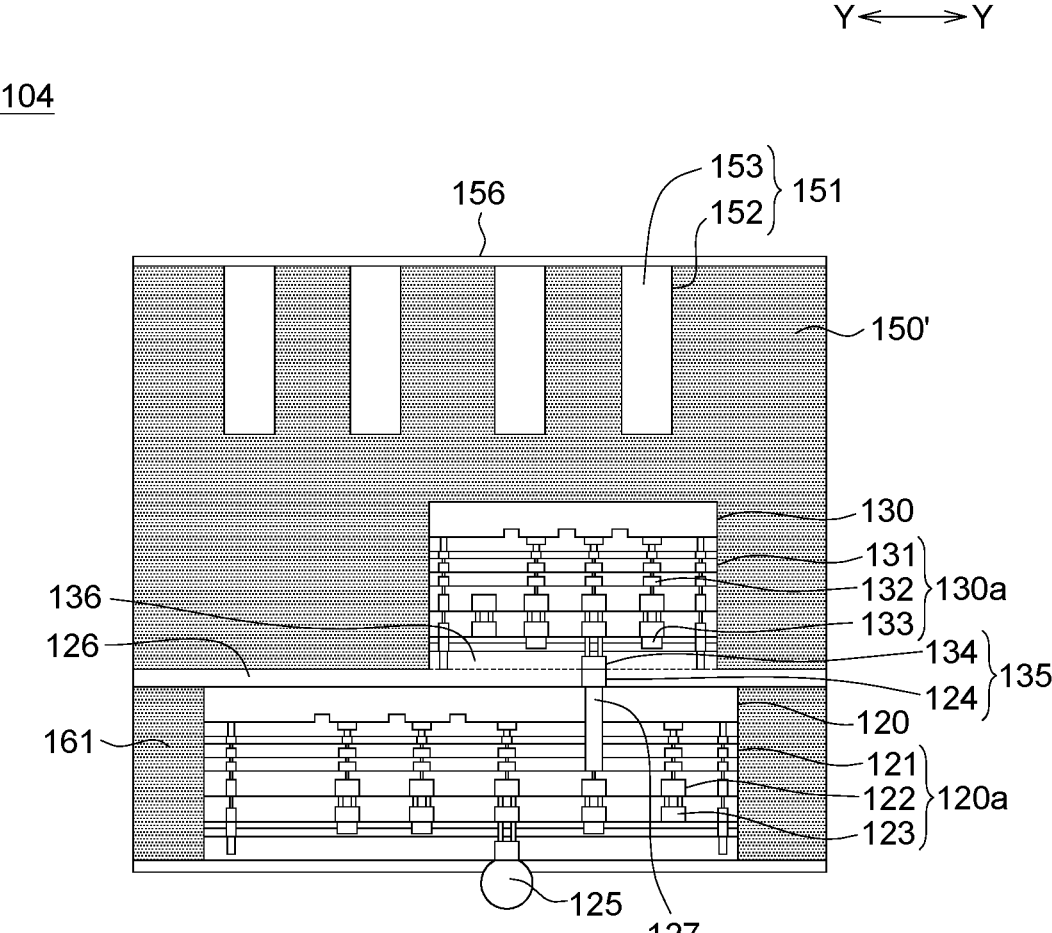
FIGS. 6A to 6B are respectively schematic cross-sectional views of a chip package structure and a stress balance structure thereof according to another two embodiments of the present disclosure.
Figure 6B:
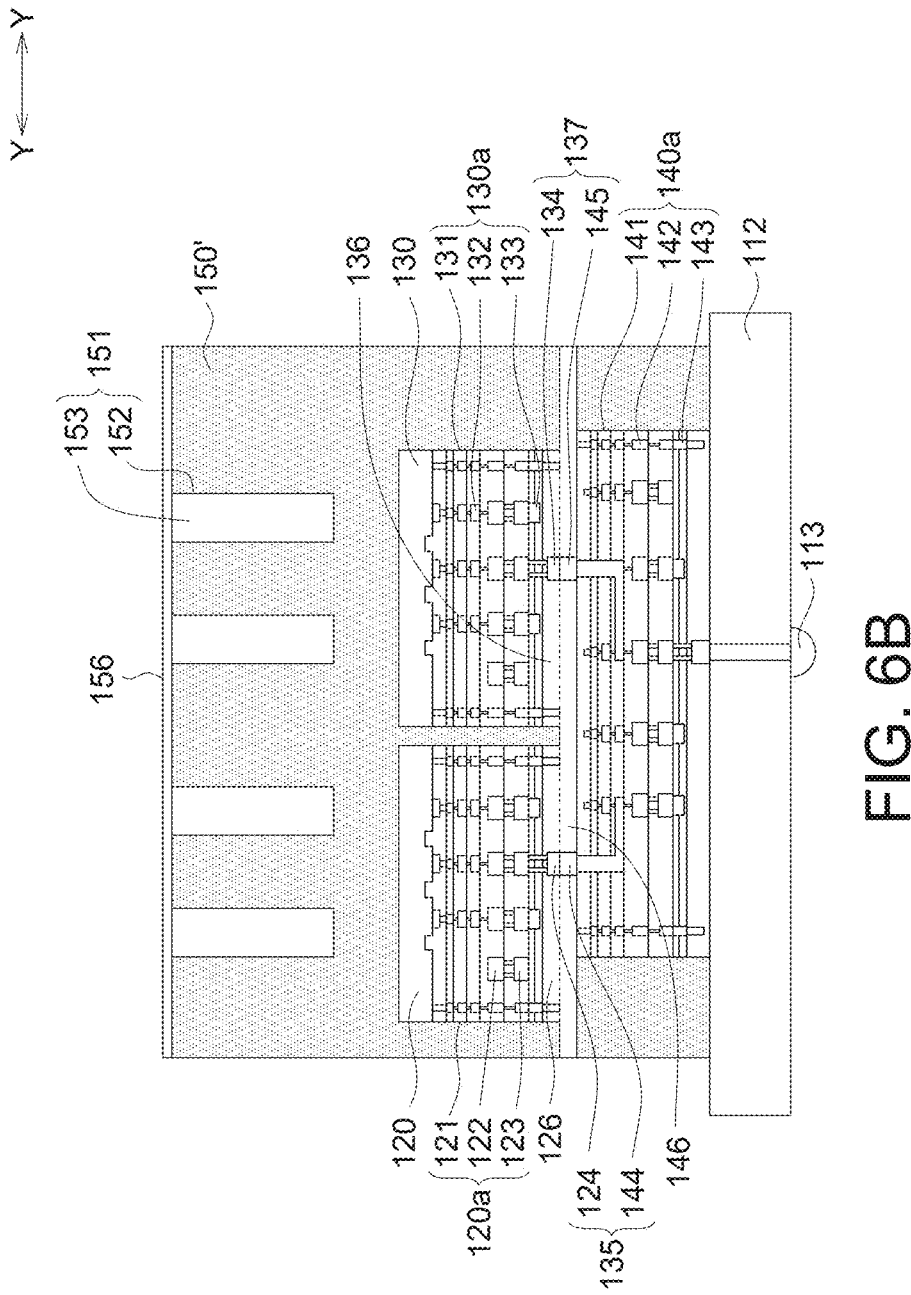

Referring to FIGS. 6A to 6B, FIGS. 6A to 6B are schematic cross-sectional views of chip package structures 104 and 105 along the Y-Y axis and the stress balance structure 151 thereof according to another two embodiments of the present disclosure, respectively. The chip package structure 104 in FIG. 6A is similar to the chip package structure 101 in FIG. 4C, except that the package carrier 150' in FIG. 6A is formed of epoxy molding material to cover the first semiconductor device 120.

In FIG. 6A, the chip package structure 104 includes a first semiconductor device 120, a second semiconductor device 130 and a package carrier 150' stacked on each other. The first semiconductor device 120 has a first redistribution structure 120a, the second semiconductor device 130 has a second redistribution structure 130a, and the die bonding structure 135 is electrically connected between the first redistribution structure 120a and the second redistribution structure 130a. The package carrier 150' covers the first semiconductor device 120 and the second semiconductor device 130, and the stress balance structure 151 is disposed in the package carrier 150'.

In some embodiments, after the package carrier 150' is cured, a patterning process is performed on the backside of the package carrier 150', and the trench 152 can be etched in the package carrier 150' using a patterned mask. Next, a stress balance material 153 is deposited in the trench 152 with a metal material or an insulating material by chemical vapor deposition, physical vapor deposition, spin coating or other suitable processes. After the deposition process is completed, a planarization process, such as chemical mechanical polishing (CMP), grinding, etching, or a combination thereof, can be performed to make the top surface of the stress balance structure 151 coplanar with the top surface of the package carrier 150'.

In FIG. 6B, the chip package structure 105 includes a carrier substrate 112, a first semiconductor device 120 and a second semiconductor device 130 disposed adjacent to each other, a bridge circuit 140a, and a package carrier 150'. The first semiconductor device 120 has a first redistribution structure 120a, the second semiconductor device 130 has a second redistribution structure 130a, and the first die bonding structure 135 is electrically connected between the bridge circuit 140a and the first redistribution structure 120a. The second die bonding structure 137 is electrically connected between the bridge circuit 140a and the second redistribution structure 130a. The package carrier 150' covers the first semiconductor device 120 and the second semiconductor device 130, and the stress balance structure 151 is disposed in the package carrier 150'.

In some embodiments, the carrier substrate 112 is, for example, a silicon substrate, a printed circuit board, or other suitable substrates, the bridge circuit 140a is disposed on the carrier substrate 112, and the bridge circuit 140a is formed on the carrier substrate 112 by a redistribution process, for example. The structure and method of the bridge circuit 140a are generally similar to the above-mentioned first redistribution structure 120a and second redistribution structure 130a, and will not be repeated here. The bridge circuit 140 may include a third redistribution dielectric layer 141, a third redistribution wiring interconnect 142 and a third bonding pad 143. The third redistribution dielectric layer 141 includes a dielectric polymer material, such as polyimide (PI), benzocyclobutene (BCB) or polybenzobisoxazole (PBO).

In some embodiments, the first semiconductor device 120 and the second semiconductor device 130 are disposed on the bridge circuit 140a. The first die bonding structure 135 disposed between the first semiconductor device 120 and the bridge circuit 140a uses a suitable bonding method (e.g., metal-metal bonding including Cu-Cu bonding or Al-Al bonding) to connect with the first redistribution structure 120a and bridge circuit 140a. The first die bonding structure 135 includes a first conductive bump 124 and a third conductive bump 144, the first conductive bump 124 and the third conductive bump 144 are, for example, copper bumps, and the first conductive bump 124 is disposed on an active side of a semiconductor device 120. The third conductive bump 144 is disposed on the top surface of the bridging circuit 140a, and the first conductive bump 124 is electrically connected to the third conductive bump 144. In addition, the second die bonding structure 137 disposed between the second semiconductor device 130 and the bridge circuit 140a uses a suitable bonding method (for example, metal-metal bonding including Cu—Cu bonding or Al—Al bonding) to connect with the second redistribution structure 130a and the bridge circuit 140a. The second die bonding structure 137 includes a second conductive bump 134 and a fourth conductive bump 145. The second conductive bump 134 and the fourth conductive bump 145 are, for example, copper bumps. The second conductive bump 134 is disposed on the active side of the second semiconductor device 130. The fourth conductive bump 145 is disposed on the top surface of the bridging circuit 140a, and the second conductive bump 134 is electrically connected to the fourth conductive bump 145. In some embodiments, the first semiconductor device 120 and the second semiconductor device 130 can be electrically connected to each other through the first die bonding structure 135, the second die bonding structure 137 and the bridge circuit 140a. In addition, the first semiconductor device 120 and the second semiconductor device 130 can also be electrically connected to the solder balls 113 (or conductive bumps) under the carrier substrate 112 through the bridge circuit 140a, respectively.

In some embodiments, the first semiconductor device 120 includes a first bonding film 126, and the second semiconductor device 130 includes a second bonding film 136. The first bonding film 126 is disposed on the active side of the first semiconductor device 120, and the second bonding film 136 is disposed on the active side of the second semiconductor device 130. In addition, the bridge circuit 140a includes a third bonding film 146 disposed on the top surface of the bridge circuit 140a. The active side of the first semiconductor device 120 is provided on the third bonding film 146 on the top surface of the bridge circuit 140a with the first bonding film 126, and the active side of the second semiconductor device 130 is provided on the third bonding film 146 on the top surface of the bridge circuit 140a with the second bonding film 136. In some embodiments, hybrid bonding or fusion bonding is used to dispose the first semiconductor device 120 and the second semiconductor device 130 on the bridge circuit 140a. The bonding includes pre-bonding and annealing. During pre-bonding, a small pressure is applied to bond the first semiconductor device 120 and the bridge circuit 140a to each other by Van der Waals force, and to bond the second semiconductor device 130 and the bridge circuit 140a to each other by Van der Waals force.

In some embodiments, the first conductive bump 124 passes through the first bonding film 126, the second conductive bump 134 passes through the second bonding film 136, and the third conductive bump 144 passes through the third bonding film 146, the fourth conductive bump 145 passes through the third bonding film 146, the first conductive bump 124 and the third conductive bump 144 are bonded to each other by hybrid bonding or fusion bonding, and the second conductive bump 134 and the fourth conductive bumps 145 are bonded to each other by hybrid bonding or fusion bonding.

In some embodiments, the package carrier 150' is formed by, for example, an epoxy molding material to encapsulate the first semiconductor device 120 and the second semiconductor device 130. The package carrier 150' includes, for example, an epoxy molding compound (EMC), and the epoxy-containing compound can be hardened (i.e., cured) to provide the function of a dielectric material with sufficient hardness and mechanical strength. EMC may include Epoxy resins, curing agents, silica (as filler material) and other additives. EMC can be available in liquid form or solid form depending on viscosity and fluidity. Liquid EMC generally provides better handling, good fluidity, fewer voids, better filling and fewer flow marks. Solid EMC generally provides less cure shrinkage, better stand-off, and less die drift. High filler content in EMC (e.g., 85% by weight) reduces molding time, molding shrinkage, and molding warpage. Uniform filler size distribution in EMC can reduce flow marks and enhances flow. The curing temperature of EMC can be lower than the release (peel) temperature of the die attaching film (DAF).

In some embodiments, after the package carrier 150' is cured, a patterning process is performed on the backside of the package carrier 150', and the trench 152 can be etched in the package carrier 150' using a patterned mask. Next, a stress balance material 153 is deposited in the trench 152 with a metal material or an insulating material by chemical vapor deposition, physical vapor deposition, spin coating or other suitable processes. After the deposition process is completed, a planarization process, such as chemical mechanical polishing (CMP), grinding, etching, or a combination thereof, can be performed to make the top surface of the stress balance structure 151 coplanar with the top surface of the package carrier 150'.

Referring to FIGS. 6A to 6B, a method for preventing warpage of a chip package structure is provided in the present embodiment, which includes the following steps. Sequentially form a first semiconductor device 120 and a second semiconductor device 130 on a carrier substrate 110 or 112. The carrier substrate 110 or 112 is, for example, a silicon substrate or other suitable substrates. The carrier substrates 110 and 112 can be used in a wafer-level packaging process. Although the carrier substrate 110 is not shown in FIG. 6A, it is conceivable that the carrier substrate 110 may be removed after the package carrier 150 is formed. The first semiconductor device 120 has a first redistribution structure 120a, the second semiconductor device 130 has a second redistribution structure 130a, the first semiconductor device 120 is arranged opposite to the second semiconductor device 130 (as shown in FIG. 6A) or adjacent to each other (as shown in FIG. 6B), the first redistribution structure 120a and the second redistribution structure 130a are electrically connected through at least one die bonding structure. In FIG. 6A, the die bonding structure 135 is vertically connected between the first semiconductor device 120 and the second semiconductor device 130. In FIG. 6B, the first die bonding structure 135 is vertically connected between the first semiconductor device 120 and the bridge circuit 140a, the second die bonding structure 137 is vertically connected between the second semiconductor device 130 and the bridge circuit 140a, and the bridge circuit 140a is electrically connected between the first semiconductor device 120 and the second semiconductor device 130. Next, a package carrier 150 or 150' is formed, and the package carrier 150 or 150' covers the first semiconductor device 120 and the second semiconductor device 130. As shown in FIG. 4C and FIG. 5A, the package carrier 150 can be made of fiber material, polymer material, semiconductor material, or glass material, and the package carrier 150' can be formed of epoxy molding material. Next, a stress balance structure 151 is formed in the package carrier 150 or 150'. The stress balance structure 151 is distributed in the package carrier 150 or 150' according to a warpage characteristic of the chip package structure 101-105. The configuration of the stress balance structure 151 can be referred to FIG. 3A to FIG. 3D, and will not be repeated here.

In some embodiments, the chip package structures 104, 105 of FIGS. 6A and 6B may further include another stress balance structures 155, 156 disposed in at least one of the first semiconductor device 120 and the second semiconductor device 130. The configuration of the stress balance structures 155, 156 can be referred to FIG. 5A and FIG. 5B, and will not be repeated here.

The present disclosure relates to a chip package structure and a method for preventing warpage of the chip package structure. The stress balance structure for preventing warpage of the chip package structure can be formed according to the warpage characteristic so as to balance the stress of the chip package structure in different warping directions.

According to some embodiments of the present disclosure, a chip package structure is provided, including a first semiconductor device, a second semiconductor device, a die bonding structure, a package carrier and a stress balance structure. The first semiconductor device has a first redistribution structure, the second semiconductor has a second redistribution structure, and the die bonding structure is electrically connected between the first redistribution structure and the second redistribution structure. The package carrier covers the first semiconductor device and the second semiconductor device, and the stress balance structure is disposed in the package carrier.

According to some embodiments of the present disclosure, a chip package structure is provide, including a first semiconductor device, a second semiconductor device, a bridge circuit, a first die bonding structure, a second die bonding structure, a package carrier and a stress balance structure. The first semiconductor device has a first redistribution structure, the second semiconductor has a second redistribution structure, the first die bonding structure is electrically connected between the bridge circuit and the first redistribution structure, and the second die bonding structure is electrically connected between the bridge circuit and the second redistribution structure. The package carrier covers the first semiconductor device and the second semiconductor device, and the stress balance structure is disposed in the package carrier.

According to some embodiments of the present disclosure, a method for preventing warpage of a chip package structure is provided, including the following steps, a first semiconductor device and a second semiconductor device are sequentially disposed on a carrier substrate, the first semiconductor device has a first redistribution structure, the second semiconductor device has a second redistribution structure, the first semiconductor device and the second semiconductor device are disposed opposite to or adjacent to each other, and the first redistribution structure and the second redistribution structure are electrically connected through at least one die bonding structure. A package carrier is formed, and the package carrier covers the first semiconductor device and the second semiconductor device. A stress balance structure is formed in the package carrier, and the stress balance structure is distributed in the package carrier according to a warpage characteristic of the chip package structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package structure, comprising:
a first semiconductor device having a first redistribution structure;
a second semiconductor device having a second redistribution structure;
a die bonding structure electrically connected between the first redistribution structure and the second redistribution structure;
a dummy device disposed on the die bonding structure and stacking on the first semiconductor device;
a package carrier covering the first semiconductor device and the second semiconductor device; and
a stress balance structure arranged in the package carrier and overlapping with the dummy device.

2. The chip package structure according to claim 1, wherein the stress balance structure comprises at least one trench and a filling material filled in the at least one trench.

3. The chip package structure according to claim 2, wherein the filling material comprises aluminum, copper, tungsten, titanium, TaN, TiN, silicon dioxide, silicon carbide, silicon nitride or a combination thereof.

4. The chip package structure according to claim 2, wherein the at least one trench is an elongated structure with a long side perpendicular to a warping direction or parallel to the warping direction.

5. The chip package structure according to claim 1, wherein a material of the package carrier comprises fiber material, polymer material, semiconductor material, glass material or a combination thereof.

6. The chip package structure according to claim 1, wherein the die bonding structure comprises a first conductive bump and a second conductive bump, the first conductive bump is disposed on a backside of the first semiconductor device, and the first conductive bump is electrically connected to the first redistribution structure through a through-silicon-via structure, the second conductive bump is arranged on an active side of the second semiconductor device, and the second conductive bump is electrically connected to the second redistribution structure.

7. The chip package structure according to claim 6, wherein the first semiconductor device comprises a first bonding film, the second semiconductor device comprises a second bonding film, and the first bonding film is disposed on the first semiconductor device, the second bonding film is disposed on the active side of the second semiconductor device, and the active side of the second semiconductor device is disposed on the first bonding film with the second bonding film.

8. The chip package structure according to claim 7, wherein the first conductive bump passes through the first bonding film, the second conductive bump passes through the second bonding film, and the first conductive bump and second conductive bump are bonded to each other using hybrid bonding or fusion bonding.

9. The chip package structure according to claim 1, further comprising another stress balance structure disposed in at least one of the first semiconductor device and the second semiconductor device.

10. A chip package structure, comprising:
a first semiconductor device having a first redistribution structure;
a second semiconductor device having a second redistribution structure;
a bridge circuit;
a first die bonding structure electrically connected between the bridge circuit and the first redistribution structure;
a second die bonding structure electrically connected between the bridge circuit and the second redistribution structure;
a package carrier covering the first semiconductor device and the second semiconductor device; and
a stress balance structure arranged in the package carrier.

11. The chip package structure according to claim 10, wherein the first die bonding structure comprises a first conductive bump and a third conductive bump, the first conductive bump is disposed on an active side of the first semiconductor device, the third conductive bump is disposed on a top surface of the bridging circuit, and the first conductive bump is electrically connected to the third conductive bump, and the second die bonding structure includes a second conductive bump and a fourth conductive bump, the second conductive bump is arranged on an active side of the second semiconductor device, the fourth conductive bump is arranged on the top surface of the bridging circuit, and the second conductive bump is electrically connected to the four conductive bump.

12. The chip package structure according to claim 11, wherein the first semiconductor device comprises a first bonding film, the second semiconductor device comprises a second bonding film, the first bonding film is disposed on the active side of the first semiconductor device, the second bonding film is disposed on the active side of the second semiconductor device, the bridge circuit includes a third bonding film disposed on the top surface of the bridge circuit, the active side of the first semiconductor device is disposed on the third bonding film with the first bonding film, and the active side of the second semiconductor device is disposed on the third bonding film with the second bonding film.

13. The chip package structure according to claim 12, wherein the first conductive bump passes through the first bonding film, the second conductive bump passes through the second bonding film, and the third conductive bump passes through the third bonding film, the fourth conductive bump passes through the third bonding film, the first conductive bump and the third conductive bump are bonded to each other by hybrid bonding or fusion bonding, and the second conductive bump and the fourth conductive bump are bonded to each other by hybrid bonding or fusion bonding.

14. The chip package structure according to claim 10, further comprising another stress balance structure disposed in at least one of the first semiconductor device and the second semiconductor device.

15. A method of preventing warpage of a chip package structure, comprising:

sequentially forming a first semiconductor device and a second semiconductor device on a carrier substrate, wherein the first semiconductor device has a first redistribution structure, the second semiconductor device has a second redistribution structure, the first semiconductor device is disposed opposite to or adjacent to the second semiconductor device, and the first redistribution structure and the second redistribution structure are electrically connected to each other through at least one die bonding structure;

disposing a dummy device on the die bonding structure and the dummy device stacking on the first semiconductor device;

forming a package carrier covering the first semiconductor device and the second semiconductor device; and forming a stress balance structure in the package carrier, and the stress balance structure overlapping with the dummy device, wherein the stress balance structure is distributed in the package carrier according to a warpage characteristic of the chip package structure.

16. The method according to claim 15, wherein the package carrier is formed by an epoxy molding material to cover at least one of the first semiconductor device and the second semiconductor device.

17. The method according to claim 16, wherein after the package carrier is cured, a patterning process is performed on a backside of the package carrier, and at least one trench is etched in the package carrier using a patterned mask, and a stress balance material is deposited in the at least one trench to form the stress balance structure.

18. The method according to claim 15, wherein the package carrier is a carrier substrate, a patterning process is performed on a backside of the package carrier, and at least one trench is etched in the package carrier using a patterned mask, and a stress balance material is deposited in the at least one trench to form the stress balance structure.

19. The method according to claim 15, wherein the stress balance structure comprises a material selected from aluminum, copper, tungsten, titanium, TaN, TiN, silicon dioxide, silicon carbide, silicon nitride or a combination thereof.

20. The method according to claim 15, further comprising forming another stress balance structure in at least one of the first semiconductor device and the second semiconductor device.

* * * * *